(12) United States Patent
Cho

(10) Patent No.: US 8,680,552 B2
(45) Date of Patent: Mar. 25, 2014

(54) LIGHT EMITTING DEVICE PACKAGE INCLUDING LIGHT EMITTING DIODE, AND LIGHTING SYSTEM HAVING THE SAME

(75) Inventor: Bum Chul Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/095,595

(22) Filed: Apr. 27, 2011

(65) Prior Publication Data
US 2011/0198653 A1 Aug. 18, 2011

(30) Foreign Application Priority Data
Apr. 28, 2010 (KR) .................. 10-2010-0039396

(51) Int. Cl.
*H01L 33/00* (2010.01)

(52) U.S. Cl.
USPC .............................. 257/98; 438/29

(58) Field of Classification Search
None
See application file for complete search history.

(56) References Cited

U.S. PATENT DOCUMENTS

| | | | |
|---|---|---|---|
| 6,474,531 B2 * | 11/2002 | Ozawa | 228/103 |
| 7,608,200 B2 * | 10/2009 | Seto et al. | 252/301.4 F |
| 7,714,341 B2 | 5/2010 | Chil Keun et al. | |
| 7,964,888 B2 | 6/2011 | Loh et al. | |
| 8,395,170 B2 * | 3/2013 | Kim | 257/98 |
| 2001/0040239 A1 * | 11/2001 | Isokawa | 257/81 |
| 2005/0073846 A1 * | 4/2005 | Takine | 362/296 |
| 2005/0082561 A1 | 4/2005 | Suehiro et al. | |
| 2006/0001055 A1 * | 1/2006 | Ueno et al. | 257/257 |
| 2007/0029654 A1 * | 2/2007 | Sunohara et al. | 257/678 |
| 2007/0246724 A1 | 10/2007 | Wen et al. | |
| 2008/0006837 A1 * | 1/2008 | Park et al. | 257/98 |
| 2008/0048205 A1 | 2/2008 | Okazaki | |
| 2009/0289272 A1 | 11/2009 | Kim et al. | |
| 2010/0012967 A1 * | 1/2010 | Choi et al. | 257/99 |
| 2011/0175122 A1 * | 7/2011 | Kim | 257/98 |

FOREIGN PATENT DOCUMENTS

| | | | | |
|---|---|---|---|---|
| CN | 101101944 A | 1/2008 | | |
| CN | 101689590 A | 3/2010 | | |
| EP | 1 876 653 A2 | 1/2008 | | |
| JP | 2008-53290 A | 3/2008 | | |
| KR | 10-0869530 B1 | 11/2008 | | |
| KR | 20-2009-0005228 U | 6/2009 | | |
| KR | 10-2010-0039678 A | 4/2010 | | |
| WO | WO 2009014376 A2 * | 1/2009 | | H01L 33/00 |
| WO | WO 2009031856 A2 * | 3/2009 | | H01L 33/00 |

* cited by examiner

*Primary Examiner* — Andres Munoz
(74) *Attorney, Agent, or Firm* — Birch, Stewart, Kolasch & Birch, LLP

(57) ABSTRACT

A light emitting device package of the embodiment includes a body; an insulating layer on a surface of the body; at least one electrode layer on the insulating layer; and a light emitting device on the at least one electrode layer. The electrode layer includes a thermal diffusion layer and a reflective layer on the thermal diffusion layer, and the thermal diffusion layer has a thickness thicker than a thickness of the reflective layer by at least twenty times.

19 Claims, 6 Drawing Sheets

LIGHT EMITTING DEVICE PACKAGE INCLUDING LIGHT EMITTING DIODE, AND LIGHTING SYSTEM HAVING THE SAME

The present application claims priority of Korean Patent Application No. 10-2010-39396 filed on Apr. 28, 2010, which is hereby incorporated by reference in its entirety.

BACKGROUND

A light emitting diode (LED) is a semiconductor light emitting device that converts current into light. The LED can generate light having high brightness, so that the LED has been expensively used as a light source for a display device, a vehicle, or a lighting device. In addition, the LED can represent a white color having superior light efficiency by employing phosphors or combining LEDs having various colors.

In order to improve the brightness and the performance of the LED, various attempts have been performed to improve a light extracting structure, an active layer structure, current spreading, an electrode structure, and a structure of a light emitting diode package.

SUMMARY

The embodiment provides a light emitting device package including an electrode layer capable of improving the heat dissipation efficiency.

The embodiment provides a light emitting device package having a package structure capable of improving the heat dissipation efficiency.

A light emitting device package according to the embodiment includes a body; an insulating layer on a surface of the body; at least one electrode layer on the insulating layer; and a light emitting device on the at least one electrode layer, wherein the electrode layer includes a thermal diffusion layer and a reflective layer on the thermal diffusion layer, and the thermal diffusion layer has a thickness thicker than a thickness of the reflective layer by at least twenty times.

A light emitting device package according to the embodiment includes a body having a cavity; an insulating layer on a surface of the body; a plurality of electrode layers on the insulating layer; a light emitting device on at least one of the electrode layers in the cavity; and a molding member covering the light emitting device in the cavity, wherein the electrode layers include a thermal diffusion layer and a reflective layer on the thermal diffusion layer, and the thermal diffusion layer has a thickness thicker than a thickness of the reflective layer by at least twenty times.

A lighting system according to the embodiment includes a plurality of light emitting device packages; a board to mount the light emitting device packages thereon; and an optical member in a light path of the light emitting device packages. The light emitting device package includes a body; an insulating layer on a surface of the body; at least one electrode layer on the insulating layer; and a light emitting device on the at least one electrode layer, wherein the electrode layer includes a thermal diffusion layer and a reflective layer on the thermal diffusion layer, and the thermal diffusion layer has a thickness thicker than a thickness of the reflective layer by at least twenty times.

DETAILED DESCRIPTION OF THE EMBODIMENTS

Figure 1:
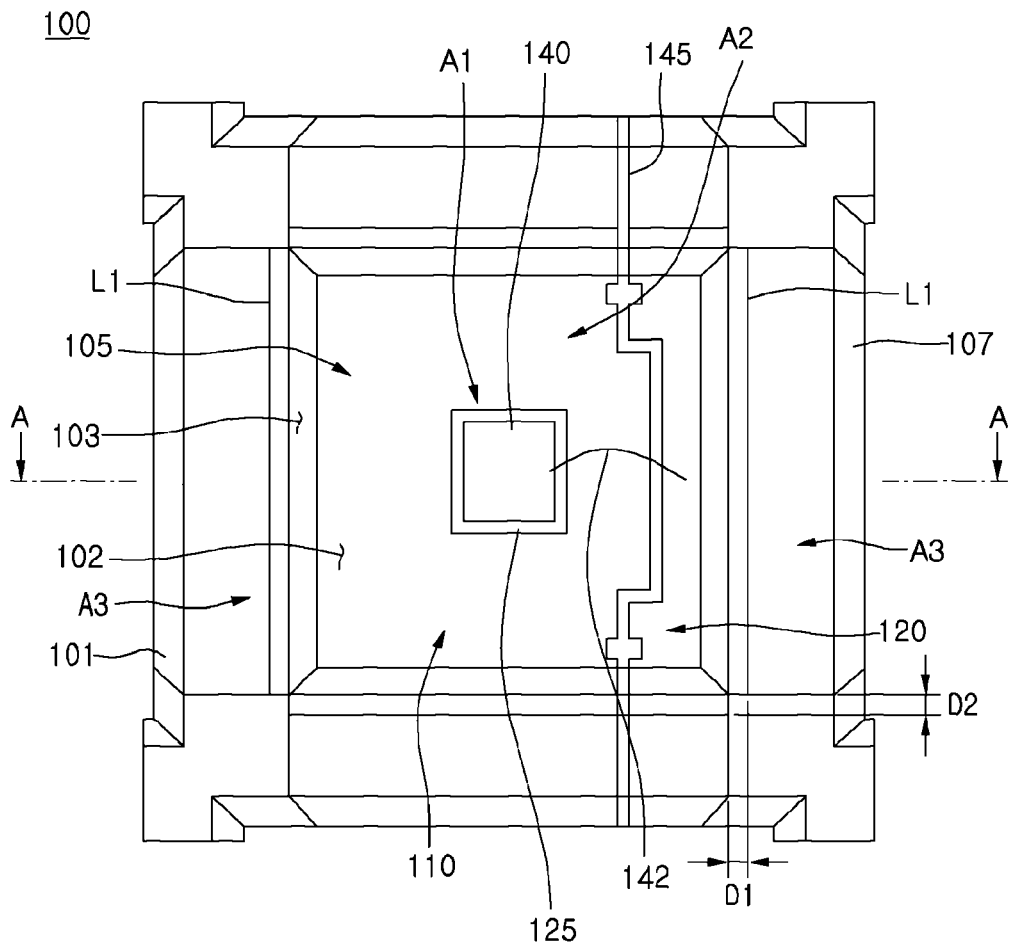
FIG. 1 is a plan view of a light emitting device package according to the first embodiment.

In the description of the embodiments, it will be understood that, when a layer (or film), a region, a pattern, or a structure is referred to as being "on" or "under" another substrate (or board), another layer (or film), another region, another pad, or another pattern, it can be "directly" or "indirectly" on the other substrate, layer (or film), region, pad, or pattern, or one or more intervening layers may also be present. When an element is referred to as being 'on' or 'under', 'under the element' as well as 'on the element' can be included based on the element. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, embodiments will be described with reference to accompanying drawings. Each layer shown in the drawings is illustrative purpose only and the embodiment is not limited to the thickness shown in the drawings.

Figure 2:
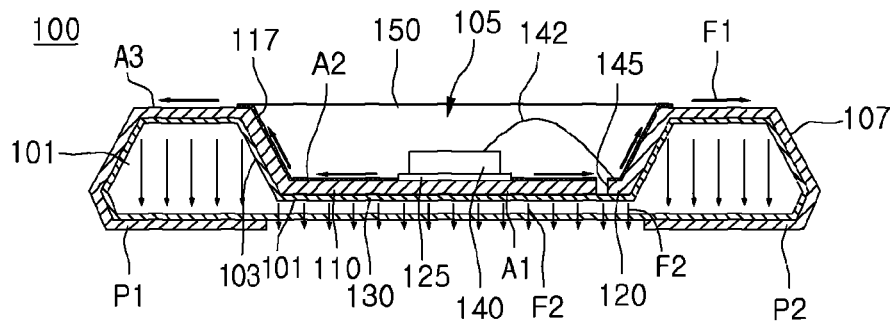
FIG. 2 is a side sectional view taken along line A-A of FIG. 1.

FIG. 1 is a plan view of a light emitting device package according to the first embodiment, and FIG. 2 is a side sectional view taken along line A-A of FIG. 1.

Referring to FIGS. 1 and 2, the light emitting device package 100 includes a body 101, an insulating layer 130, first and second electrode layers 110 and 120, and a light emitting device 140.

The body 101 may include a silicon material. For instance, the body 10 may include wafer level package (WLP) having a silicon wafer. The body 101 can be formed by using Al, AlN, AlO$_x$, PSG (photo sensitive glass), Al$_2$O$_3$, BeO, PCB (Printed Circuit Board) or various resins in addition to the silicon. According to the embodiment, the silicon is used as a material for the body 101 to improve the manufacturing efficiency and the heat dissipation efficiency of the light emitting device package.

The body 101 can be formed through the bulk etching process, such as wet etching, dry etching or laser drilling. At least two of the above etching processes can be performed to form the body 101. A deep reactive ion etching is a representative one of the dry etching processes.

A cavity 105 having a predetermined depth can be formed on an upper portion of the body 101 through the etching process. An upper portion of the cavity 105 is open. For instance, the cavity 105 can be prepared in the form of a base tube recess, a polygonal recess or a circular recess, but the embodiment is not limited thereto. In order to form the cavity 105, a patterning process is performed by using a mask and a wet etching process is performed by using wet etchant, for instance, anisotropic wet etchant, such as a KOH solution, TMAH or EDP.

A peripheral side 103 of the cavity 105 may be inclined at a predetermined angle with respect to a bottom surface 102 of the cavity 105. In addition, the peripheral side 103 of the cavity 105 may be substantially perpendicular to the bottom surface 102 of the cavity 105 or may be curved, but the embodiment is not limited thereto. A lateral side 107 of the body 101 may be bent at a predetermined angle or may be upright. The lateral side 107 of the body 101 includes an upper lateral side inclined from a top surface of the body 101 at a first angle and a lower lateral side inclined from a lower surface of the body 101 at a second angle. The upper lateral side and the lower lateral side form an edge of the body 101. The lateral side of the body 101 is etched by a predetermined angle according to the crystalline property of the package material or can be formed through a cutting process. The shape of the lateral side of the body 101 can be variously modified within the scope of the embodiment without being limited to the features shown in the drawings.

A thickness between the lower surface of the body 101 and the bottom surface of the cavity 105 may be thinner than a thickness of other regions of the body 101. Preferably, the thickness between the lower surface of the body 101 and the bottom surface of the cavity 105 is the thinnest in the body 101. The thickness may vary depending on the etching scheme.

The insulating layer 130 is formed on the body 101 and the electrode layers 110 and 120 are formed on the insulating layer 130. The insulating layer 130 insulates the electrode layers 110 and 120 from the body 101. The insulating layer 130 covers an area wider than the electrode layers 110 and 120, thereby preventing the body 101 from making contact with other conductive materials.

For instance, the insulating layer 130 includes at least one selected from the group consisting of a silicon thermal oxide layer ($SiO_2$ or $Si_xO_y$), AlOx, a silicon nitride layer ($Si_3N_4$, $Si_xN_y$, or $SiO_xN_y$), AlN, and $Al_2O_3$.

The electrode layers 110 and 120 include a first electrode layer 110 and a second electrode layer 120. The first and second electrode layers 110 and 120 include a plurality of metal layers. The first and second electrode layers 110 and 120 may be formed by using metallic materials having thicknesses suitable for improving the thermal conductivity, electric property and light reflection efficiency.

The first electrode layer 110 is disposed at one side of the body 101 and the second electrode layer 120 is disposed at the other side of the body 101. The one side of the body 101 may be opposite to or corresponding to the other side of the body 101.

The first electrode layer 110 may extend to one side of a surface of the cavity 105 as well as to one side of the top surface, the first lateral side and one side of the lower surface of the body 101. The second electrode layer 120 may extend to the other side of the surface of the cavity 105 as well as to the other side of the top surface, the second lateral side and one side of the lower surface of the body 101. The first lateral side may be a left lateral side and the second lateral side may be a right lateral side.

An end P1 of the first electrode layer 110 may be used as a first lead terminal and an end P2 of the second electrode layer 120 may be used as a second lead terminal.

In order to form the first and second electrode layers 110 and 120, a photoresist is coated on the insulating layer 130 and the photoresist is subject to the exposure and developing process such that the photoresist is selectively exposed, thereby forming a mask pattern. Then, the first and second electrode layers 110 and 120 are selectively deposited on a region where the mask pattern is not formed through the sputtering, plating (electro plating or electroless plating) or E-beam evaporation scheme. After that, the lift off process is performed, but the embodiment is not limited thereto.

The first and second electrode layers 110 and 120 are separated from each other by a separation part 145. The separation part 145 is disposed between the first and second electrode layers 110 and 120 and extends from the cavity 105 to the top surface of the body 101. The separation part 145 can be prepared as a recess. In this case, an insulating material is filled in the recess. The separation part 145 may have a depth corresponding to a thickness of the first electrode layer 110 or the second electrode layer 120.

At least one doping region can be formed in the body 101. The doping region can be defined as a well region. The doping region can be formed by implanting or diffusing impurities onto the top surface and/or the bottom surface of the body 101. The doping region may have polarity opposite to that of the body 101. For instance, the doping region may include a P type semiconductor, but the embodiment is not limited thereto. In this case, the body 101 may include an N type semiconductor. Thus, the doping region and the body 101 may constitute at least one of P-N, P-N-P, N-P and N-P-N junction structures. Such a junction structure may serve as a protective device, such as a Zener diode, or a current regulator device.

The doping region can make contact with one of the first and second electrode layers 110 and 120.

The light emitting device 140 may be disposed on the first electrode layer 110 and/or the second electrode layer 120. The following description will be made on the assumption that the light emitting device 140 is disposed on the first electrode layer 110 for the purpose of convenience of explanation.

The light emitting device 140 is disposed on the first electrode layer 110 at the center of the cavity 105.

The first and second electrode layers 110 and 120 may have variable thickness depending on the regions thereof. The first and second electrode layers 110 and 120 can be divided into a reflective region and a lead region. The reflective region has reflectivity higher than that of the lead region. A bonding region is formed in the reflective region. The thickness of the reflective region in the first and second electrode layers 110 and 120 may be thinner than the thickness of the lead region. In addition, the thickness of the bonding region in the first and second electrode layers 110 and 120 may be thinner than the thickness of the reflective region. In the first and second electrode layers 110 and 120, the bonding region and the lead region may have the same metal stack structure.

The reflective region may be a second region A2, the lead region may be a third region A3 and the bonding region may be a first region A1.

The second region A2 may extend to the bottom surface 102 of the cavity 105, the peripheral side 103 of the cavity 105, and a part L1 of the top surface of the body 101. The width D1 and D2 of the second region A2 exposed to the top surface of the body 101 may be 1 μm or more, but the embodiment is not limited thereto.

A bonding member 125 is disposed between the light emitting device 140 and the first electrode layer 110. The bonding member 125 has an area larger than an area of the lower surface of the light emitting device 140.

The bonding member 125 can be disposed on the first region A1 of the first electrode layer 110 to bond the light emitting device 140 to the first electrode layer 110.

The light emitting device 140 can be bonded to the bonding member 125 through a die attach scheme. The bonding member 125 may include a eutectic metal including at least one of Au—Sn, Pb—Sn and In. The above materials can be formed through the E-beam evaporation scheme.

For instance, the light emitting device 140 may include an LED chip of a visible ray band, such as a blue LED chip, a green LED chip, a red LED chip or a yellow LED chip, or a UV (ultraviolet) band. However, the embodiment does not limit the type and number of the light emitting devices 140.

The light emitting device 140 includes a group III-V compound semiconductor layer having the composition formula of $In_xAl_yGa_{1-x-y}N$ ($0 \leq x \leq 1$, $0 \leq y \leq 1$, $0 \leq x+y \leq 1$). The compound semiconductor layer may include a first conductive semiconductor layer, an active layer and a second conductive semiconductor layer, which are sequentially stacked. A substrate is disposed under the semiconductor layers. The substrate may include an insulating substrate, such as a sapphire substrate, or a conductive substrate. The substrate may be formed by growing the semiconductor layer or may be additionally prepared. In addition, an ohmic layer, a reflective layer, and a conductive support member may be further disposed under the semiconductor layers. Power can be supplied through the conductive support member.

The light emitting device 140 can be electrically connected to the first and second electrode layers 110 and 120. The light emitting device 140 is bonded onto the first electrode layer 110 and connected to the second electrode layer 120 through a wire 142. The light emitting device 140 can be bonded to the first and second electrode layers 110 and 120 through a flip scheme or connected to the first and second electrode layers 110 and 120 through at least two wires, but the embodiment is not limited thereto. One end of the wire 142 may serve as a reflective layer or a bonding layer of the second electrode layer 120.

The first and second electrode layers 110 and 120 may be formed by stacking at least four metal layers. In detail, the first region A1 and the third region A3 of the first electrode layer 110 can be formed by at least four metal layers, and the second region A2 of the first and second electrode layers 110 and 120 may be formed by at least five metal layers. The number of layers constituting the stack structure of the second region A2 may be more than the number of layers constituting the stack structure of the other regions A1 and A3 by at least one layer.

The first and third regions A1 and A3 may have the same layer structure or the same thickness.

The first and second electrode layers 110 and 120 include a reflective layer 117. The reflective layer 117 may be formed on the reflective region, that is, the second region A2.

A molding member 150 is formed in the cavity 105. The molding member 150 may include a transmittive resin material, such as silicon or epoxy. The surface of the molding member 150 may have a flat shape, a concave shape or a convex shape. The molding member 150 may include at least one type of phosphors. The phosphors may selectively include a red phosphor, green phosphor and a yellow phosphor including at least one of YAG, TAG, Silicate, Nitride, and Oxynitride-based materials.

A lens (not shown) may be formed on the molding member 150. For instance, the lens formed on the molding member 150 may include a convex lens, a concave lens or a combination thereof. The lens can be separated from the molding member 150 or can be integrally formed with the molding member 150. A luminescent film including at least one type of phosphors may be formed on the cavity 105, but the embodiment is not limited thereto.

Silicon gel including a phosphor or epoxy having superior a transmittive property can be formed on a desired region of the molding member 150 through the screen printing scheme.

A method of manufacturing the light emitting device package is as follows. A cavity region and a lateral side of the body 101 are etched and the insulating layer 130 is formed. Then, the mask pattern is aligned on the insulating layer 130 and the electrode layers 110 and 120 are formed. After mounting the light emitting device 140 on the first electrode layer 110, the light emitting device 140 is wire-bonded to the second electrode layer 120. Then, the molding member 150 is molded on the cavity 105. Next, the body 101 is cut into a package unit. The cutting surface may be selectively formed in various regions except for the lateral side where the first and second electrode layers 110 and 120 are formed.

Hereinafter, the stack structure of the first and second electrode layers 110 and 120 will be described with reference to FIG. 3.

Figure 3:
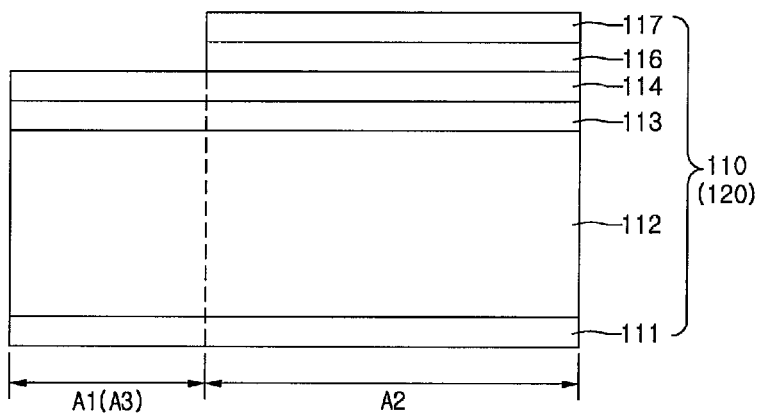
FIG. 3 is a sectional view showing each region of an electrode layer of FIG. 2.

Referring to FIG. 3, the first and second electrode layers 110 and 120 include a seed layer 111, a thermal diffusion layer 112, a barrier layer 113, a bonding layer 114, an adhesive layer 116 and a reflective layer 117.

The first and third regions A1 and A3 of the electrode layers 110 and 120 may have the structure of the seed layer 111, the thermal diffusion layer 112, the barrier layer 113, and the bonding layer 114. The second region A2 of the electrode layers 110 and 120 may include the seed layer 111, the thermal diffusion layer 112, the barrier layer 113, the bonding layer 114, the adhesive layer 116 and the reflective layer 117.

The seed layer 111 is formed on the insulating layer 130 (see, FIG. 2), the thermal diffusion layer 112 is formed on the seed layer 111, the barrier layer 113 is formed on the thermal diffusion layer 112, and the bonding layer 114 is formed on the barrier layer 113. In addition, the adhesive layer 116 is disposed between the bonding layer 114 and the reflective layer 117.

The seed layer 111 may include a material representing a superior adhesive property with respect to the insulating layer or a superior bonding property with respect to other metal layers. For instance, the seed layer 111 includes Ti, Cr or Ta and can be defined as an adhesive layer. The seed layer 111 may have a thickness of about 900 Å±200 Å.

The seed layer 111 may be prepared as a single-layer structure or a multiple-layer structure. For instance, the seed layer 111 may selectively include Ti, Cr, Ta and an alloy thereof. If the seed layer 111 has the multiple-layer structure, the thickness of the seed layer 111 may be increased.

The thermal diffusion layer 112 may be formed on the seed layer 111 by using a metal having superior thermal conductivity, such as copper (Cu). The thermal diffusion layer 112 has a thickness of about 10~50 μm, preferably, about 30 μm±2 μm.

The thermal diffusion layer 112 may be closer to the seed layer 11, the insulating layer or the surface of the body than to the reflective layer 117.

The thickness of the thermal diffusion layer 112 may be at least 85% based on the thickness of the second region A2 of the electrode layers 110 and 120. If the thermal diffusion layer 112 has the above thickness, the thermal resistance may be increased in the vertical direction, that is, in the thickness direction of the body and the thermal diffusion velocity is increased in the horizontal direction, that is, in the direction perpendicular to the thickness of the body.

The thermal diffusion layer 112 may include Ag, Au, Al or carbon nano tube in addition to Cu.

The thermal conductivity and thermal resistance of the thermal diffusion layer 112 may be obtained as follows.

The heat transfer per a unit area is proportional to the temperature gradient and inversely proportional to the thickness of the thermal diffusion layer 112. If the proportional constant K is adopted, the terminal conduction qx of the thermal diffusion layer 112 is as follows.

$$q_x = -kA\frac{1}{\Delta x}(T_2 - T_1) \quad \text{Equation 1}$$

qx: one-dimensional conductive heat per hour (kcal/hr)
A: thermal conductive area (m$^2$)
Δx: thickness of diffusion layer
k: thermal conductivity (w/mK)
T1 and T2: temperature at front and rear surfaces of object In addition, the thermal resistance R can be obtained as follows:

$$R = \frac{\Delta x}{kA} \quad \text{Equation 2}$$

The thermal resistance R of the thermal diffusion layer 112 is proportional to the thickness Δx of the thermal diffusion layer 112 and inversely proportional to the thermal conductive area. If the thickness Δx of the thermal diffusion layer 112 is increased, the thermal resistance in the thermal diffusion layer 112 may be increased. In addition, if the thermal resistance in the thermal diffusion layer 112 is increased, the thermal diffusion velocity is increased in the horizontal direction (transverse direction) more than the vertical direction (longitudinal direction), so that the effective heat dissipation area of the thermal diffusion layer 112 may be increased. If the effective heat dissipation area of the thermal diffusion layer 112 is increased, the thermal conductive area A can be increased, so that the thermal resistance of the package can be lowered.

Since the thickness of the thermal diffusion layer 112 is represented in the unit of μm and the heat dissipation area of the thermal diffusion layer 112 is represented in the unit of mm, there is difference by about 1000 times. In addition, since the thermal diffusion layer 112 includes a material having the superior thermal conductivity, such as Cu, it is possible to increase the effective heat dissipation area in the horizontal direction without increasing the thickness of the thermal diffusion layer 112. Thus, if the thickness of the thermal diffusion layer 112 is increased, the heat may be rapidly diffused in the horizontal direction through the thermal diffusion layer 112, so that the effective heat dissipation area and the thermal conductive area can be increased.

When comparing with the effective heat dissipation area of other packages, the effective heat dissipation area of the package having the thermal diffusion layer 112 may be increased by substantially 10 times. Thus, if the thickness of the thermal diffusion layer 112 is set by taking the effective heat dissipation area of the thermal diffusion layer 112 into consideration, the maximum and optimum heat dissipation efficiency can be realized in the thermal diffusion layer 112.

A sub-seed layer can be formed between the seed layer 111 and the thermal diffusion layer 112. The sub-seed layer may include Au or Cu. The seed layer 111 may have the stack structure of Cr/Au, Cr/Cu, Ti/Au, Ta/Cu, or Ta/Ti/Cu. The sub-seed layer formed between the seed layer 111 and the thermal diffusion layer 112 may have the thickness of about 6000 Å±500 Å.

The barrier layer 113 may be formed on the thermal diffusion layer 112. The barrier layer 113 can prevent the electric characteristic of the bonding layer 114 from being deteriorated by the thermal diffusion layer 112 under the high-temperature environment. The barrier layer 113 may include Pt or Ni and have the thickness of about 3000 Å±500 Å.

The bonding layer 114 may be formed on the barrier layer 113. The bonding layer 114 is a plating layer including Au and has the thickness of about 5000 Å±500 Å.

As shown in FIGS. 2 and 3, the bonding member 125 is formed on the bonding layer 114 in the first region A1. The bonding member 125 is used for the eutectic bonding and bonded to the bonding layer 114. At this time, the bonding efficiency may vary depending on the surface roughness of the bonding layer 114. In detail, if the surface roughness of the bonding layer 114 is increased, air may be introduced into a bonding interface so that the thermal conductivity may be lowered. Thus, the thermal conductivity can be improved by lowering the surface roughness. According to the embodiment, the surface roughness of the bonding layer 114 may be restricted less than 30 nm by forming the bonding layer 114 through the plating scheme.

If the thermal diffusion layer 112 includes Cu, the barrier layer 113 includes Ni and the bonding layer 114 includes Au, the first and third regions A1 and A3 may have the stack structure of Cr/Au/Cu/Ni/Au, Cr/Cu/Cu/Ni/Au, Ti/Au/Cu/Ni/Au, Ta/Cu/Cu/Ni/Au, or Ta/Ti/Cu/Cu/Ni/Au. In the above stack structure, if the thermal diffusion layer 112 has the thickness of about 10 μm to 50 μm, the thermal resistance of the metal layer can be lowered.

The adhesive layer 116 and the reflective layer 117 are stacked on the bonding layer 114 in the second region A2 of the electrode layers 110 and 120. The adhesive layer 116 is used to bond adjacent two metals and includes Ti, Cr or Ta. The adhesive layer 116 may have the thickness of about 900 Å±100 Å and may be omitted.

The reflective layer 117 is formed on the adhesive layer 116. The reflective layer 117 may include a metal or an alloy having superior reflectivity. For instance, the reflective layer 117 may selectively include Al, Ag, an Al alloy, or an Ag alloy. The reflectance of the reflective layer 117 is at least 70%, preferably, at least 90% with respect to the light of the visible ray band, so the reflective efficiency can be improved. The reflective layer 117 may have the thickness of about 1500 Å±300 Å.

The reflective layer 117 is formed on a surface of the second region A2. The thermal diffusion layer 112 may have the thickness of about 10 μm to 50 μm. The thickness of the thermal diffusion layer 112 is at least 50%, preferably, at least 85% based on the thickness of the electrode layers 110 and 120. The thickness of the thermal diffusion layer 112 is thicker than the thickness of the reflective layer 117 by about several ten times, for instance, at least twenty times. The thickness of the thermal diffusion layer 112 is thicker than the thickness of the bonding layer 114 by at least 66 times.

In order to improve the heat dissipation efficiency, the electrode layers 110 and 120 may have the thickness thicker than the thickness of the insulating layer 130 (see, FIG. 2) by at least twenty times. In addition, the thermal diffusion layer 112 may have the thickness thicker than the thickness of the reflective layer 117 by at least twenty times. If the thermal diffusion layer 112 has the above thickness, the effective heat dissipation area can be increased so that the heat dissipation efficiency and the electric reliability of the light emitting device can be improved.

If the thermal diffusion is increased in the horizontal direction at the thermal diffusion layer 112, the effective heat dissipation area of the thermal diffusion layer 112 may expand to the bottom and the peripheral side of the cavity 105 and the top surface of the body. If the effective heat dissipation area of the thermal diffusion layer 112 is increased, the heat generated from the light emitting device 140 may be rapidly diffused in the horizontal direction through the thermal diffusion layer 112, so that the heat can be effectively dissipated through the whole surface of the electrode layers 110 and 120.

Hereinafter, the operation of the light emitting device package 100 will be described with reference to FIGS. 1 to 3.

If the power is supplied through the electrode layers 110 and 120, the light emitting device 140 emits the light. The emitted light is discharged to the outside through the molding member 150.

Then, the thermal diffusion layer 112 including a material having thermal conductivity higher than that of other layers is disposed in at least one of the electrode layers 110 and 120. The thermal diffusion layer 112 has the thickness relatively thicker than the thickness of other layers, so the thermal diffusion efficiency can be improved.

If the thickness of one of the electrode layers 110 and 120 is increased, the heat generated from the light emitting device 140 can be rapidly diffused in the horizontal direction rather than the vertical direction. If the thickness of the electrode layers 110 and 120 is increased, the thermal resistance of the electrode layers 110 and 120 is increased proportionally to the thickness of the electrode layers 110 and 120. In addition, if the thermal resistance of the electrode layers 110 and 120 is increased, the thermal diffusion in the horizontal direction at the surface of the electrode layers 110 and 120 can be increased at a predetermined ratio. The horizontal direction can be a length and/or width direction of the package and the vertical direction can be a thickness direction of the package.

The thermal flow generated from the light emitting device 140 may be divided into a first thermal flow F1 flowing in the horizontal direction based on the light emitting device 140 and a second thermal flow F2 flowing in the vertical direction. The first and second thermal flows F1 and F2 may vary depending on the electrode layers 110 and 120. According to the embodiment, the heat transfer efficiency in the horizontal direction can be improved at the electrode layers 110 and 120, so that the first thermal flow F1 is greater than the second thermal flow F2 in the electrode layers 110 and 120. Thus, the effective heat dissipation area can be increased in the electrode layers 110 and 120. In addition, the first thermal flow F1 transferred in the horizontal direction of the electrode layers 110 and 120 is greater than the second thermal flow F2 transferred to the body 101, so that the effective heat dissipation area of the electrode layers 110 and 120 can be increased. Therefore, the thermal diffusion in the horizontal direction of the electrode layers 110 and 120 is increased, so that the surface area that attributes to the heat dissipation, that is, the effective heat dissipation area of the electrode layers 110 and 120 is increased, thereby improving the heat dissipation efficiency at the electrode layers 110 and 120 and the body 101 including a silicon material.

The heat generated from the light emitting device 140 may diffuse from the electrode layers 110 and 120 in the cavity 105 to the electrode layer formed on the top surface of the body 101. That is, the effective heat dissipation area of the electrode layers 110 and 120 can be increased. In addition, the heat transferred to the electrode layers 110 and 120 through the body 101, so that the effective heat dissipation area of the body 101 can be increased. Thus, the heat dissipation efficiency of the light emitting device package can be improved because the effective heat dissipation area of the electrode layers 110 and 120 and the body 101 can be increased.

Figure 4:
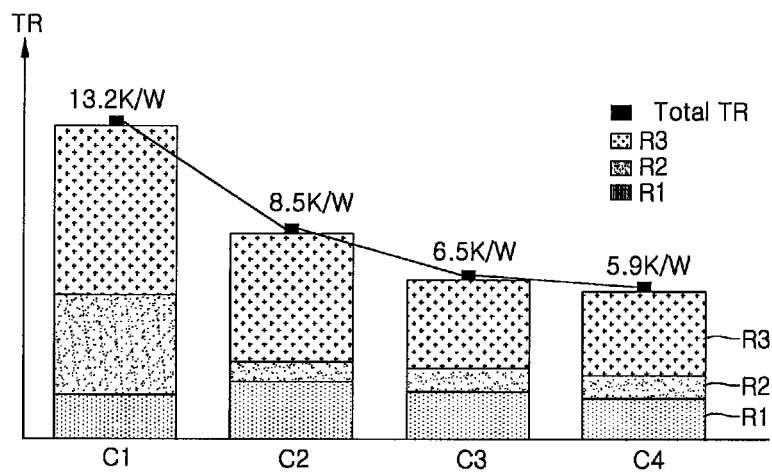
FIG. 4 is a graph showing thermal resistance of a package according to the embodiment.

FIG. 4 is a graph showing the thermal resistance of the electrode layer according to the embodiment.

Referring to FIG. 4, in the first example C1, the light emitting device is prepared without the bonding process, the roughness of the bonding layer is about 28 nm, and the thickness of the thermal diffusion layer is about 0.6 µm. The thermal resistance TR is 13.2K/W, in which the chip resistance R1 is small but the resistance R3 of the thermal diffusion layer is relatively increased, so that the total thermal resistance is rarely improved. The chip resistance may be a resistance value of a structure below an active layer of the chip.

In the second example C2, the light emitting device is prepared through the bonding process (eutectic bonding), the roughness of the bonding layer is about 28 nm, and the thickness of the thermal diffusion layer is about 0.6 µm. The thermal resistance TR is 8.5K/W, in which the first resistance R1 is increased as compared with the first example C1 but the second and third resistances R2 and R3 are relatively reduced, so that the total thermal resistance is improved. The first resistance R2 is the chip resistance and corresponds to the resistance value of all layers below an active layer. The second resistance R2 is a die attach resistance value, and the third resistance R3 is a resistance value generated from the bonding layer of the package, the body and a board (for instance, MCPCB). Such an improvement of the thermal resistance may induce the thermal diffusion in the horizontal direction through the thickness increase of the thermal diffusion layer, so that the effective heat dissipation area can be increased, thereby improving the total thermal resistance of the package.

In the third example C3, the light emitting device is prepared through the bonding process (eutectic bonding), the roughness of the bonding layer is about 11 nm, and the thickness of the thermal diffusion layer is about 30 µm. The thermal resistance TR is 6.5K/W, in which the first and third resistances R1 and R3 are increased as compared with the second example C2, so that the total thermal resistance is improved.

Therefore, according to the embodiment, the thickness of the thermal diffusion layer is relatively thick and the light emitting device is bonded through the die attach scheme, so that the effective light emitting area can be improved. Thus, the thermal conductive area can be increased so that the resistance of the thermal diffusion layer, the chip resistance, and the die attach resistance can be lowered. In addition, the total thermal resistance of the electrode layer can be improved, so that the heat dissipation efficiency can be more improved.

Figure 5:
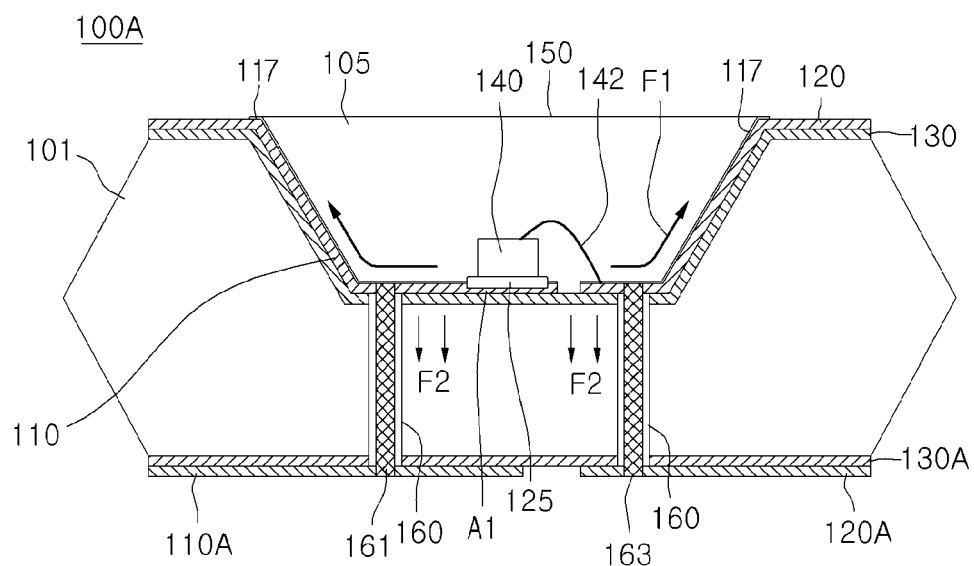
FIG. 5 is a sectional view showing a light emitting device package according to the second embodiment.

FIG. 5 is a sectional view showing a light emitting device package according to the second embodiment. In the following description of the second embodiment, the elements and structures the same as those of the first embodiment will be referred to the first embodiment and detailed description thereof will be omitted in order to avoid redundancy.

Referring to FIG. 5, the light emitting device package 100A includes a body 101 having a cavity 105, insulating layers 130 and 130A, a plurality of electrode layers 110 and 120, a light emitting device 140, lead electrodes 110A and 120A, and via members 160 and 161.

The insulating layers 130 and 130A are formed on the top and lower surfaces of the body 101. The insulating layer is not formed on the lateral side of the body 101, so the lateral side of the body 101 is exposed to the outside.

The electrode layers 110 and 120 are formed on the insulating layer 130 on the top surface the body 101, and the lead electrodes 110A and 120A are formed on the insulating layer 130A on the lower surface of the body 101.

The via members 160 and 161 are formed in the body 101. The via members 160 and 161 include a through hole 160 and a via 161 formed in the through hole 160. The via 161 includes an insulating material so that the via 161 is insulated from the body 101.

The via 161 connects the electrode layers 110 and 120 to the lead electrodes 110A and 120A to provide a power path.

According to the second embodiment, the thermal diffusion layer 112 as shown in FIG. 3 is formed in formed in the electrode layers 110 and 120, so that the effective heat dissipation area and the thermal conductive area are increased, thereby lowering the thermal resistance of the package. In addition, the first thermal flow F1 flowing in the horizontal direction is greater than the second thermal flow F2 flowing in the vertical direction, so that the heat dissipation efficiency of the package can be improved.

Figure 6:
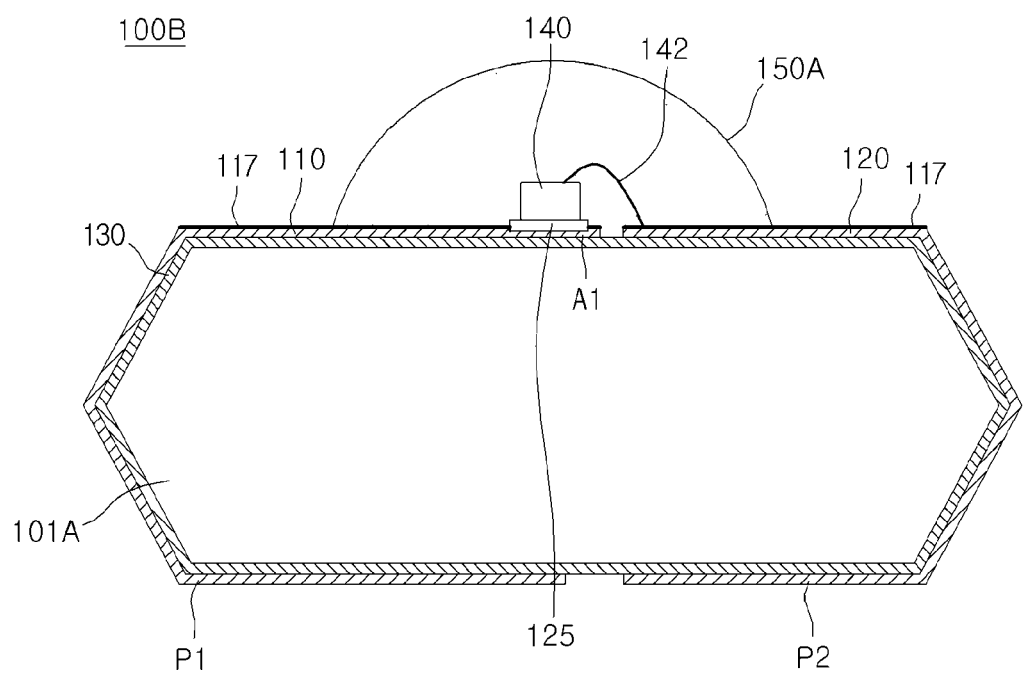
FIG. 6 is a sectional view showing a light emitting device package according to the third embodiment.

FIG. 6 is a sectional view showing a light emitting device package according to the third embodiment. In the following description of the third embodiment, the elements and structures the same as those of the first embodiment will be referred to the first embodiment and detailed description thereof will be omitted in order to avoid redundancy.

Referring to FIG. 6, the light emitting device package 100B includes a body 101A having a flat top surface, an insulating layer 130, a plurality of electrode layers 110 and 120, a light emitting device 140, lead electrodes P1 and P2, and a lens 150A.

The lens 150A is convexly formed on the light emitting device 140 by using a molding member to adjust the orientation angle of the light.

The light emitting device according to the embodiments is die-bonded to the second lead electrode through an insulating substrate or a growth substrate and then packaged so as to be used as a light source for an indicator, a lighting apparatus or a display device. In addition, one embodiment may not be limited thereto, but may be selectively applicable to other embodiments.

Figure 7:
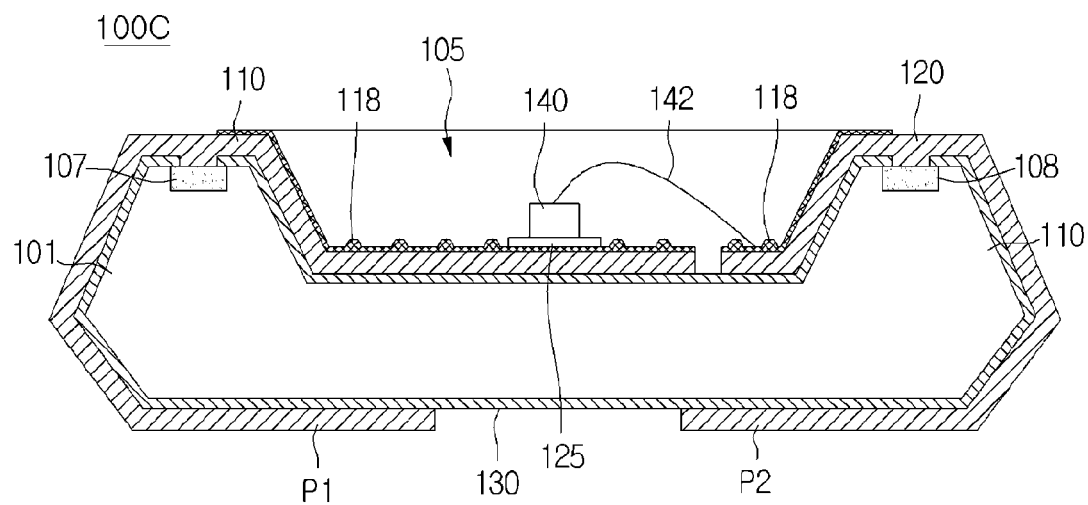
FIG. 7 is a sectional view showing a light emitting device package according to the fourth embodiment.

FIG. 7 is a sectional view showing a light emitting device package according to the fourth embodiment. In the following description of the fourth embodiment, the elements and structures the same as those of the first embodiment will be referred to the first embodiment and detailed description thereof will be omitted in order to avoid redundancy.

Referring to FIG. 7, the light emitting device package 100C includes a plurality of protrusions 118 formed on the surface of the electrode layers 110 and 120. The protrusions 118 effectively reflect the light emitted from the light emitting device 140. The protrusions 118 of the electrode layers 110 and 120 may be disposed in the cavity 105, but the embodiment is not limited thereto.

The protrusions 118 of the electrode layers 110 and 120 improve the reflective efficiency and coupling strength with respect to the molding member 150.

The protrusions 118 of the electrode layers 110 and 120 may protrude from one of layers shown in FIG. 2. For instance, the protrusions 118 of the electrode layers 110 and 120 may protrude from the reflective layer 117. In addition, rough protrusions can be formed on the other layers of the electrode layers 110 and 120 or on the surface of the insulating layer 130 in such a manner that the protrusions 118 can be formed on the surface of the electrode layers 110 and 120.

A plurality of doping regions 107 and 108 can be formed in the body 101. The doping regions 107 and 108 can be defined as a well region. The doping regions can be formed in different areas of the body 101 by implanting or diffusing impurities onto the body 101. The doping regions 107 and 108 may have polarity opposite to that of the body 101. For instance, the doping regions may include a P type semiconductor, but the embodiment is not limited thereto. In this case, the body 101 may include an N type semiconductor.

The first doping region 107 is connected to the first electrode layer 110 and the second doping region 108 is connected to the second electrode layer 120. Thus, the doping regions 107 and 108, the body 101 and the electrode layers 110 and 120 may constitute at least one of P-N, P-N-P, N-P and N-P-N junction structures. Such a junction structure may serve as a protective device, such as a Zener diode, or a current regulator device.

Figure 8:
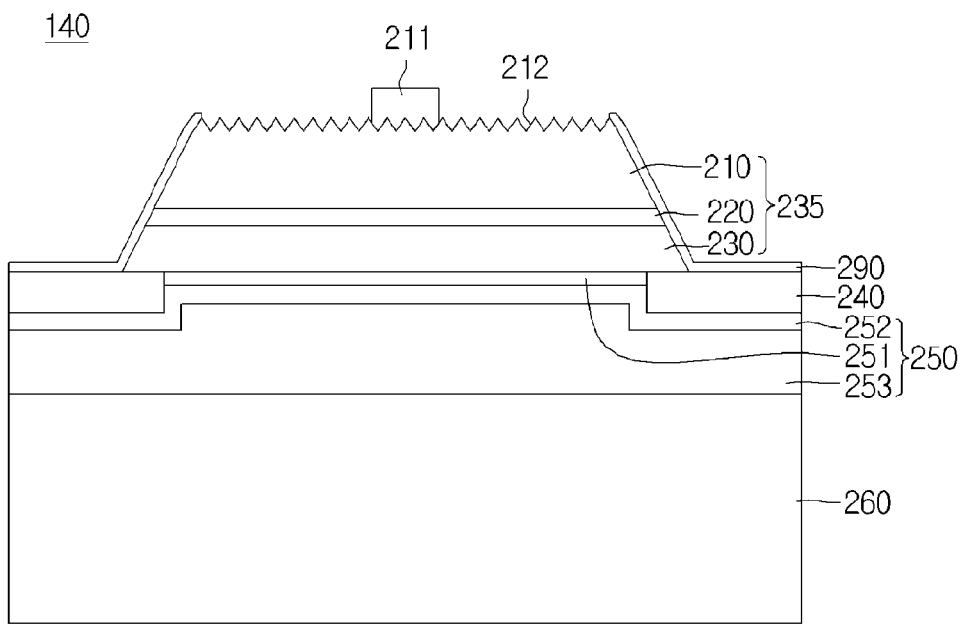
FIG. 8 is a sectional view showing an example of a light emitting device according to the embodiment.

FIG. 8 is a sectional view showing an example of a light emitting device according to the embodiment.

Referring to FIG. 8, the light emitting device 140 includes a light emitting structure 235 having a plurality of compound semiconductor layers 210, 220 and 230, a protective layer 240, a plurality of conductive layers 250, a support member 260, an insulating layer 290 and an electrode 211.

The light emitting device 140 may include a compound semiconductor, and can be prepared as a light emitting diode (LED) including a plurality of compound semiconductor layers of group III-V elements. The LED may include a visible ray LED for emitting blue, red, or green light or a UV LED. The LED may include various LEDs within the technical scope of the embodiment.

The light emitting structure layer 235 includes a first conductive semiconductor layer 210, an active layer 220, and a second conductive semiconductor layer 230.

The first conductive semiconductor layer 210 may include compound semiconductors of group III-V elements doped with first conductive dopant. For instance, the first conductive semiconductor layer 210 may include GaN, AlN, AlGaN, InGaN, InN, InAlGaN, AlInN, AlGaAs, GaP, GaAs, GaAsP, or AlGaInP. If the first conductive semiconductor layer 210 is an N type semiconductor, the first conductive dopant may include an N type dopant such as Si, Ge, Sn, Se, or Te. The first conductive semiconductor layer 210 may have a single layer structure or a multi-layer structure, but the embodiment is not limited thereto.

The first conductive semiconductor layer 210 is provided on a top surface thereof with a light extraction structure such as a roughness and/or a pattern 212 for improving the light extraction efficiency or with a transparent electrode layer or an insulating layer for the purpose of current spreading and light extraction, but the embodiment is not limited thereto.

The first conductive semiconductor layer 210 includes a plurality of semiconductor layers, and the semiconductor layers may have different dopant concentrations, different thicknesses, or different compositional formulas.

The first conductive semiconductor layer 210 may have a superlattice structure (SLS) and may include one selected from the group consisting of GaN, InN, AlN, InGaN, AlGaN, InAlGaN, $SiO_2$, $SiO_x$, $SiN_2$, $SiN_x$, $SiO_xN_y$, and a metallic material. The superlattice structure includes at least two stack structures in which at least two different layers are alternately repeated. For example, the superlattice structure includes a stack structure of InGaN/GaN. Each layer of the superlattice structure may have a thickness of at least a few Å.

The electrode 211 may be formed on the first conductive semiconductor layer 210. The electrode 211 may include a pad or an electrode pattern having a branch structure connected to the pad, but the embodiment is not limited thereto. A roughness pattern may be formed on the top surface of the electrode 211, but the embodiment is not limited thereto. A portion of the top surface of the first conductive semiconductor layer 210, at which the electrode 211 is formed, may be flat, but the embodiment is not limited thereto.

The electrode 211 may make ohmic contact with the top surface of the first conductive semiconductor layer 210, and may have a single layer structure or a multiple layer structure including at least one selected from the group consisting of Cr, Ti, Al, In, Ta, Pd, Co, Ni, Si, Ge, Ag, Cu, and Au. The electrode 211 may include one selected from the above materials by taking into consideration ohmic contact with the first conductive semiconductor layer 210, the adhesive property between metallic layers, a reflective characteristic, and a conductive characteristic.

The active layer 220 may be formed under the first conductive semiconductor layer 210 and may have a multiple quantum well structure. In addition, the active layer 220 may have a quantum wire structure or a quantum dot structure. The active layer 220 may have a stack structure of well/barrier layers by using a compound semiconductor material of group III to V elements. For example, the active layer 220 may have the stack structure of InGaN well/GaN barrier layers, InGaN well/AlGaN barrier layers, or InGaN well/InGaN barrier layers, but the embodiment is not limited thereto.

For example, the active layer 220 may include a quantum well layer having a compositional formula of $In_xAl_yGa_{1-x-y}N$ ($0 \leq x \leq 1$, $0 \leq y \leq 1$, and $0 \leq x+y \leq 1$) and a barrier layer having a compositional formula of $In_xAl_yGa_{1-x-y}N$ ($0 \leq x \leq 1$, $0 \leq y \leq 1$, and $0 \leq x+y \leq 1$).

A conductive clad layer may be formed on and/or under the active layer 220, and may include a nitride-based semiconductor. The bandgap of the barrier layer is higher than the bandgap of the well layer, and the bandgap of the conductive clad layer may be higher than the bandgap of the barrier layer.

The second conductive semiconductor layer 230 is formed under the active layer 220, and may include a compound semiconductor of a group III-V element doped with second conductive dopant. For example, the second conductive semiconductor layer 230 may include one selected from the group GaN, AlN, AlGaN, InGaN, InN, InAlGaN, AlInN, AlGaAs, GaP, GaAs, GaAsP, and AlGaInP. If the second conductive semiconductor layer is a P type semiconductor, the second conductive dopants include P type dopants such as Mg and Zn. The second conductive semiconductor layer 230 may have a single layer structure or a multiple layer structure, but the embodiment is not limited thereto.

The light emitting structure 235 may further include a third conductive semiconductor layer under the second conductive semiconductor layer 230. The third conductive semiconductor layer may have polarity opposite to the polarity of the second conductive semiconductor layer. In addition, the first conductive semiconductor layer 210 includes a P type semiconductor, and the second conductive semiconductor layer 230 includes an N type semiconductor. Accordingly, the light emitting structure 235 may include at least one of an N-P junction structure, a P-N junction structure, an N-P-N junction structure, and a P-N-P junction structure.

A protective layer 240 and a plurality of conductive layers 250 may be formed under the second conductive semiconductor layer 230 or the third conductive semiconductor layer. Hereinafter, a case in which the lowest layer of the light emitting structure 235 is the second conductive semiconductor layer 230 will be described for the purpose of explanation.

The protective layer 240 is provided at a channel region which is an outer region of a chip. The channel region serves as a chip peripheral region which forms a boundary of a chip. An outer portion of a top surface of the protective layer 240 may be exposed to the outside or may be covered by another material, for example, the insulating layer 290. A roughness or a pattern may be formed on the top surface of the protective layer 240. The protective layer 240 and the roughness or the pattern can improve light extraction efficiency in the channel region. The roughness or the pattern may include a material different from that of the protective layer 240 or a material having a refractive index different from that of the protective layer 240 at an outer portion of the top surface of the protective layer 240. The roughness or the pattern may include a group III-V compound semiconductor. For example, the roughness or the pattern may include one selected from the group consisting of GaN, AlN, AlGaN, InGaN, InN, InAlGaN, AlInN, AlGaAs, GaP, GaAs, GaAsP, and AlGaInP. The roughness or the pattern may be formed by using the second conductive semiconductor which can be formed through an isolation etching.

An inner portion of the top surface of the protective layer 240 makes contact with an outer portion of the bottom surface of the second conductive semiconductor layer 230 by a predetermined width. In this case, the contact width is within the range of a few μm to several tens μm, and may vary according to a chip size.

The protective layer 240 may be formed with a loop shape, a ring shape, or a frame shape at an outer peripheral portion of the bottom surface of the second conductive semiconductor layer 230. The protective layer 240 may have a continuous pattern shape or a discontinuous pattern shape.

The protective layer 240 may include a material having a refractive index lower than that of a group III-V compound semiconductor. For example, the protective layer 240 may include a transmissive oxide material, a transmissive nitride material, or a transmissive insulating material. The protective layer 240 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, and $TiO_2$.

If the protective layer 240 includes $SiO_2$, the refractive index of the protective layer 240 is about 2.3. In addition, if the protective layer 240 includes ITO or GaN, the refractive index of the protective layer 240 is about 2.1 or about 2.4. Light incident into the protective layer 240 through the second conductive semiconductor layer 230 may be extracted to the outside, so that the light extraction efficiency can be improved.

The protective layer 240 protects the light emitting structure 235 from being shorted even if the outer wall of the light emitting structure 235 is exposed to the moisture. Accordingly, the LED having superior endurance against high moisture can be provided. If the protective layer 240 includes a transmissive material, a laser beam is transmitted through the protective layer 240 in a laser scribing process. Accordingly, metal fragments caused by the laser beam may not be created in the channel region. Therefore, the interlayer short problem occurring on the sidewalls of the light emitting structure 235 can be prevented.

The protective layer 240 spaces the outer wall of each layer 210, 220, or 230 of the light emitting structure 235 from a first conductive layer 251. The protective layer 240 may have a thickness within the range of about 0.02 µm to about 5 µm. The thickness of the protective layer 240 may vary according to the chip sizes.

The conductive layers 250 include first to third conductive layers 251, 252, and 253, and the first conductive layer 251 makes ohmic contact with the second conductive semiconductor layer 230. The first conductive layer 251 may have a multiple layer structure including a conductive oxide material selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO, or may have a stack structure of IZO/Ni, AZO/Ag, IZO/Ag/Ni, or AZO/Ag/Ni.

A material, which is different from the first conductive layer 251 and selected from $SiO_2$, $SiO_x$, $SiO_xN_y$, $Si_3N_4$, $Al_2O_3$, and $TiO_2$, can be formed on the first conductive layer 251. The above material may be interposed between the first conductive layer 251 and the second conductive semiconductor layer 230.

The first conductive layer 251 is provided or may be provided on the bottom surface of the second conductive semiconductor layer 230. In addition, the first conductive layer 251 may cover a portion of the bottom surface of the protective layer 240. In other words, the first conductive layer 251 may have an area corresponding to at most 80% of the width of the protective layer 240 at the portion of the bottom surface of the protective layer 240.

The second conductive layer 252 is provided under the first conductive layer 251. The second conductive layer 252 may extend to the bottom surface of the protective layer 240. The first conductive layer 251 may include a reflective metal and/or a seed metal, and the seed metal is used for the plating process. Accordingly, the first conductive layer 251 may selectively include an ohmic layer, a seed layer, or a reflective layer, but the embodiment is not limited thereto.

The second conductive layer 252 may have a single layer structure or a multiple layer structure including one selected from the group consisting of Ag, Ni, Al, Rh, Pd, Ir, Ru, Mg, Zn, Pt, Au, Hf, and the combination thereof.

The third conductive layer 253 is formed under the second conductive layer 252. The third conductive layer 253 includes a barrier metal or a bonding metal. For example, the third conductive layer 253 may include at least one selected from the group consisting of Ti, Au, Sn, Ni, Cr, Ga, In, Bi, Cu, Ag, and Ta.

The third conductive layer 253 serves as a bonding layer, and a support member 260 is bonded to a bottom surface of the third conductive layer 253. The support member 260 may be attached to the second conductive layer 252 through a plating process or by using a sheet without forming the third conductive layer 253.

The support member 260 serves as a base substrate, and may include one selected from the group consisting of copper (Cu), gold (Au), nickel (Ni), molybdenum (Mo), copper-tungsten (Cu—W), and a carrier wafer (e.g., Si, Ge, GaAs, ZnO, SiC, SiGe, or GaN).

The support member 260 may be bonded o the bonding member 124 shown in FIG. 2 and electrically connected to the first electrode layer 110. The electrode 211 may be electrically connected to the second electrode layer 120 by using a wire. The heat transferred from the support member 260 to the first electrode layer 110 may be rapidly diffused in the lateral direction of the body 101, rather than the thickness direction of the body 101, so that the heat dissipation efficiency can be improved. Accordingly, the reliability for the light emitting device 140 can be improved.

The outer surface of the light emitting structure 235 may be inclined and may include an insulating layer 290. A lower end of the insulating layer 290 may partially make contact with the top surface of the protective layer 240 or may cover the entire top surface of the protective layer 240. The insulating layer 390 may include a material having a refractive index lower than that of the compound semiconductor (e.g., 2.4 in the case of GaN). For example, the insulating layer 390 may include one selected from the group consisting of $SiO_2$, $SiO_x$, $SiO_xN_y$, $Si_3N_4$, $Al_2O_3$, and $TiO_2$.

The package capable of improving the thermal resistance and the heat dissipation efficiency can be applied not only to the package 100 shown in FIG. 1, but also to the packages 100A and 100B according to other embodiments. If the above package or the package module is applied to the indicator, the lighting apparatus or the display device, the heat dissipation efficiency can be reliably improved.

<Lighting System>

The light emitting device package according to the embodiments may be used as light sources for indicating devices, lighting devices, and display devices. The lighting devices may be used for illumination lamps, traffic lights, vehicle headlights, and signs. The light emitting device package may be provided in plurality. The plurality of light emitting device packages may be arrayed on a board. A light guide plate, an optical sheet, a lens, and a reflective sheet may be disposed on an optical path in which the plurality of light emitting device packages are arrayed. Also, each of the embodiments is not limited to each of the embodiments. Also, each of the embodiments may be selectively applied to other embodiments and may not be limited to each of the embodiments.

Figure 9:
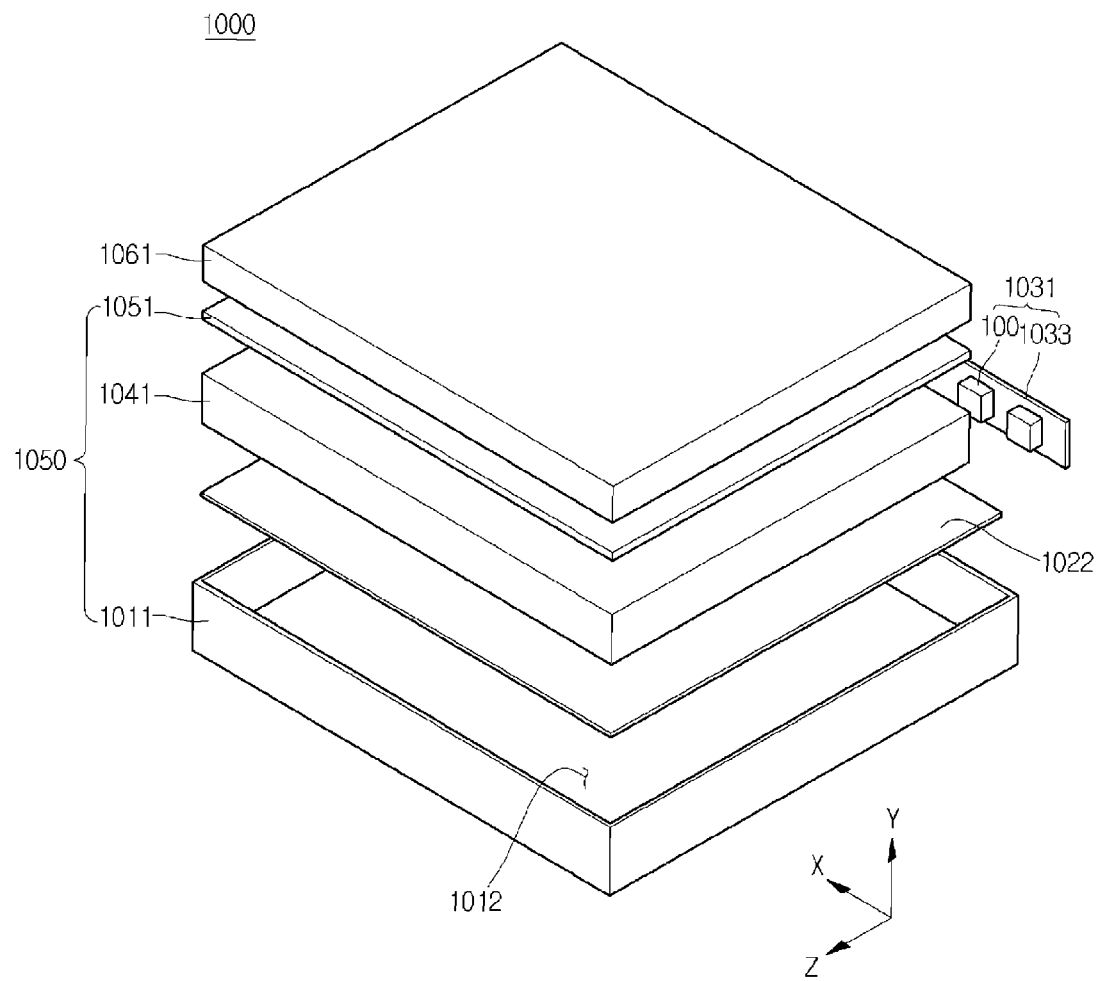
FIG. 9 is a view of a display device including a light emitting device package according to an embodiment.
Figure 10:
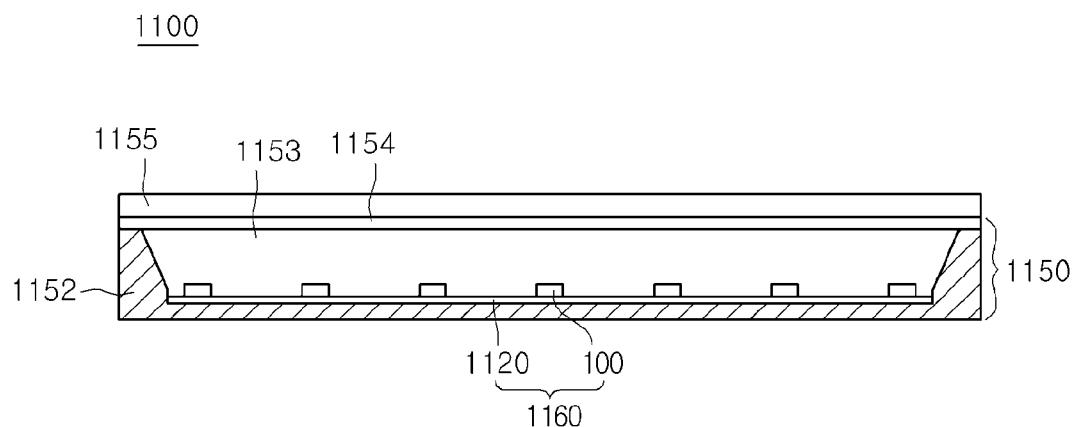
FIG. 10 is a view illustrating another example of the display device including the light emitting device package according to an embodiment.
Figure 11:
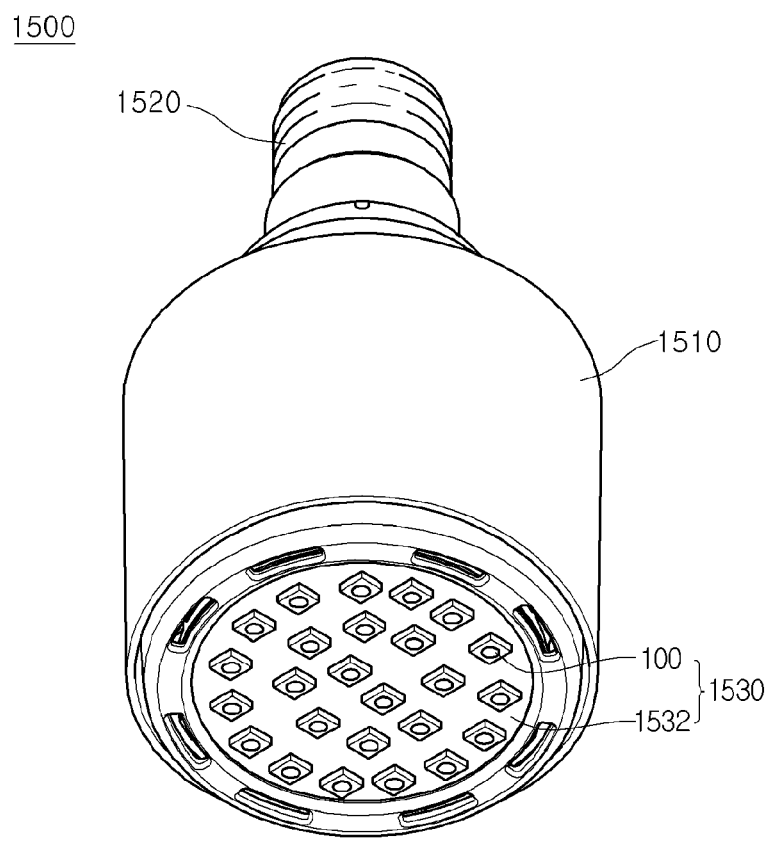
FIG. 11 is a view of a lighting device including the light emitting device package according to an embodiment.

The light unit may include the display device shown in FIGS. 9 and 10 and the lighting device shown in FIG. 11. Furthermore, the light unit may include illumination lamps, traffic lights, vehicle headlights, and signs.

FIG. 9 is an exploded perspective view of a display device according to an embodiment.

Referring to FIG. 9, a display device 1000 according to an embodiment may include a light guide plate 1041, a light emitting module 1031 providing light to the light guide plate 1041, a reflective member 1022 disposed under the light guide plate 1041, an optical sheet 1051 disposed above the light guide plate 1041, a display panel 1061 disposed above the optical sheet 1051, and a bottom cover 1011 receiving the light guide plate 1041, the light emitting module 1031, and the reflective member 1022, but is not limited thereto.

The bottom cover 1011, the reflective member 1022, the light guide plate 1041, and the optical sheet 1051 may be defined as a light unit 1050.

The light guide plate 1041 diffuses light to produce planar light. The light guide plate 1041 may be formed of a transparent material. For example, the light guide plate 1041 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 may provide light to at least one side surface of the light guide plate 1041. Thus, the light emitting module 1031 may act as a light source of a display device.

At least one light emitting module 1031 may be disposed to directly or indirectly provide light to at least one side surface of the light guide plate 1041. The light emitting module 1031 may include a board 1033 and the light emitting device package 100 according to the above-described embodiment. The light emitting device package 100 may be arrayed on the board 1033 by a predetermined distance.

The board 1033 may be a printed circuit board (PCB) including a circuit pattern (not shown). Also, the substrate 1033 may include a general PCB, a metal core PCB, and a flexible PCB, but is not limited thereto. When the light emitting device package 100 are mounted on a side surface of the bottom cover 1011 or on a heatsink plate, the board 1033 may be removed. Here, a portion of the heatsink plate may contact a top surface of the bottom cover 1011.

The plurality of light emitting device packages 100 may be mounted on the board 1033 to allow a light emitting surface through which light is emitted from the board 1033 to be spaced a predetermined distance from the light guide plate 1041, but is not limited thereto. The light emitting device package 100 may directly or indirectly provide light to a light incident surface that is a side surface of the light guide plate 1041, but is not limited thereto.

The reflective member 1022 may be disposed under the light guide plate 1041. Since the reflective member 1022 reflects light incident onto an under surface of the light guide plate 1041 to supply the reflected light upward, brightness of the light unit 1050 may be improved. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover, but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel and include first and second boards formed of a transparent material and facing each other and a liquid crystal layer between the first and second boards. A polarizing plate may be attached to at least one surface of the display panel 1061. The present disclosure is not limited to the attached structure of the polarizing plate. The display panel 1061 displays information using light transmitting the optical sheet 1051. The display device 1000 may be applied to various portable terminals, monitors for notebook computers, monitors for laptop computers, televisions, etc.

The optical sheet 1051 is disposed between the display panel 1061 and the light guide plate 1041 and includes at least one light-transmitting sheet. For example, the optical sheet 1051 may include at least one of a diffusion sheet, horizontal and vertical prism sheets, a brightness enhanced sheet, etc. The diffusion sheet diffuses incident light, and the horizontal or/and vertical prism sheet(s) collect(s) the incident light into a display region. In addition, the brightness enhanced sheet reuses lost light to improve the brightness. Also, a protection sheet may be disposed on the display panel 1061, but is not limited thereto.

Here, optical members such as the light guide plate 1041 and the optical sheet 1051 may be disposed on an optical path of the light emitting module 1031, but is not limited thereto.

FIG. 10 is a view illustrating a display device according to an embodiment.

Referring to FIG. 10, a display device 1100 includes a bottom cover 1152, a board 1120 on which the above-described light emitting device packages 100 are arrayed, an optical member 1154, and a display panel 1155.

The board 1120 and the light emitting device package 100 may be defined as a light emitting module 1060. The bottom cover 1152, the at least one light emitting module 1060, and the optical member 1154 may be defined as a light unit.

The bottom cover 1152 may include a receiving part 1153, but is not limited thereto.

Here, the optical member 1154 may include at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion sheet diffuses incident light, and the horizontal and vertical prism sheets collect the incident light into a display region. The brightness enhanced sheet reuses lost light to improve brightness.

The optical member 1154 is disposed on the light emitting module 1060 to produce planar light using the light emitted from the light emitting module 1060 or diffuse and collect the light emitted from the light emitting module 1060.

FIG. 11 is a view of a lighting device according to an embodiment.

Referring to FIG. 11, a lighting unit 1500 may include a case 1510, a light emitting module 1530 in the case 1510, and a connection terminal 1520 disposed in the case 1510 to receive an electric power from an external power source.

The case 1510 may be preferably formed of a material having good heat dissipation characteristics, for example, a metal material or a resin material.

The light emitting module 1530 may include a board 1532 and a light emitting device package 100 mounted on the board 1532. The light emitting device package 100 may be provided in plurality, and the plurality of light emitting device packages 100 may be arrayed in a matrix form or spaced a predetermined distance from each other.

The board 1532 may be an insulator on which a circuit pattern is printed. For example, the board may include a general printed circuit board (PCB), a metal core PCB, a flexible PCB, a ceramic PCB, FR-4, etc.

Also, the board 1532 may be formed of a material to efficiently reflect light, and a surface thereof may be formed in a color capable of efficiently reflecting light. For example, the board 1532 may be a coated layer having a white color or a silver color.

At least one light emitting device package 100 may be mounted on the board 1532. Each of the light emitting device packages 100 may include at least one light emitting diode (LED) chip. The LED chip may include a color LED emitting red, green, blue or white light, and a UV LED emitting ultraviolet (UV) rays.

The light emitting module 1530 may have a combination of various light emitting device packages 100 to obtain desired color and luminance. For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be screw-coupled to an external power source in a socket type, but is not limited thereto. For example, the connection terminal 1520 may be made in a pin type and inserted into the external power source or may be connected to the external power source through a wire.

A method of manufacturing the light emitting device package according to the embodiment includes the steps of forming an insulating layer on a package body; sequentially forming a seed layer, a thermal diffusion layer, a barrier layer and a bonding layer on the insulating layer; forming an adhesive layer on a second region of the bonding layer and forming a reflective layer on the adhesive layer; and bonding a light emitting device onto a first region of the bonding layer and electrically connecting the light emitting device to the reflective layer formed on a part of the second region which is electrically separated from the first region.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
    a body;
    an insulating layer on a surface of the body;
    a first electrode layer on the insulating layer;
    a second electrode layer disposed on the insulating layer and spaced apart from the first electrode layer;
    a light emitting diode on the first electrode layer; and
    a bonding member between the light emitting diode and the first electrode layer and directly connected to the light emitting diode, the bonding member having a width wider than a width of an entire bottom surface of the light emitting diode,
    wherein the first and the second electrode layers include a thermal diffusion layer and a reflective layer on the thermal diffusion layer, and the thermal diffusion layer has a thickness thicker than a thickness of the reflective layer by at least twenty times,
    wherein the first electrode layer includes a first region corresponding to the entire bottom surface of the light emitting diode and a second region at an outer portion of the first region,
    wherein the first and second regions of the first electrode layer include a bonding layer having a surface roughness,
    wherein the topmost layer of the first region of the first electrode layer is the bonding layer having the surface roughness contacted with the bonding member,
    wherein the topmost layer of the second region of the first electrode layer is the reflective layer having a different material from the bonding layer,
    wherein the first and the second electrode layers further include a seed layer disposed between the insulating layer and the thermal diffusion layer,
    wherein the seed layer physically contacts the insulating layer and the thermal diffusion layer,
    wherein the thermal diffusion layer has the thickness thicker than a thickness of the seed layer and is formed in only one layer,
    wherein the insulating layer is contacted between the seed layer and the body,
    wherein the thickness of the thermal diffusion layer is at least 85% of a thickness of the first electrode layer,
    wherein the bonding layer, the seed layer and the thermal diffusion layer include different materials from each other,
    wherein the reflective layer includes a top surface and a bottom surface opposite the top surface of the reflective layer,
    wherein a plurality of protrusions are protruded from the top surface of the reflective layer and are located at a position lower than a top surface of the light emitting diode, and
    wherein the bottom surface of the reflective layer corresponding to the plurality of protrusions is a flat surface.

2. The light emitting device package of claim 1, wherein the thickness of the first electrode layer is thicker than a thickness of the insulating layer by at least twenty times, and
    wherein the thermal diffusion layer is formed of a layer of only copper (Cu) having a thickness in a range of 30 µm±2 µm.

3. The light emitting device package of claim 1, wherein the thickness of the thermal diffusion layer is in a range of 10-50 µm.

4. The light emitting device package of claim 3, wherein the thickness of the thermal diffusion layer is thicker than a thickness of the bonding layer by at least 66 times,
    wherein the thermal diffusion layer has the thickness thicker than a combined thickness of the seed layer and the bonding layer, and
    wherein the thermal diffusion layer is formed of a layer of only copper (Cu) having a thickness in a range of 30 µm±2 µm.

5. The light emitting device package of claim 4, wherein the first and the second electrode layers further include:
    an adhesive layer between the bonding layer and the reflective layer; and
    a barrier layer between the thermal diffusion layer and the bonding layer,
    wherein the bonding layer, the adhesive layer and the barrier layer include different materials from each other,
    wherein the thermal diffusion layer has the thickness thicker than a thickness of each of the bonding layer, the adhesive layer and the barrier layer,
    wherein the first region of the first electrode layer includes at least four metal layers; and the second region of the first electrode includes at least six metal layers, and
    wherein the second electrode layer includes at least six metal layers.

6. The light emitting device package of claim 1, wherein the thermal diffusion layer includes one layer selected from the group consisting of Cu, Al, Au and Ag, and the reflective layer includes at least one selected from the group consisting of Al, an Al alloy, Ag, and an Ag alloy.

7. The light emitting device package of claim 1, further comprising a molding member disposed on the first and second electrode layers and contacted with the plurality of protrusions and the top surface of the reflective layer.

8. The light emitting device package of claim 1, wherein the light emitting diode includes a support member having a metal material or a carrier wafer and contacted with the bonding member.

9. A light emitting device package comprising:
a body having a cavity with an open top surface;
an insulating layer on a surface of the body;
a plurality of electrode layers on the insulating layer;
a light emitting diode on one of the plurality of electrode layers in the cavity;
a bonding member between the light emitting diode and the one of the plurality of electrode layers and connected to the light emitting diode, the bonding member having a width wider than a width of an entire bottom surface of the light emitting diode; and
a molding member covering the light emitting diode in the cavity,
wherein the plurality of electrode layers includes a thermal diffusion layer and a reflective layer on the thermal diffusion layer, and the thermal diffusion layer has a thickness thicker than a thickness of the reflective layer by at least twenty times,
wherein the plurality of electrode layers include a first region and a second region at an outer portion of the first region,
wherein the first region of the one of the plurality of electrode layers include a bonding layer contacted with the bonding member,
wherein the topmost layer of the first region of the one of the plurality of electrode layers is the bonding layer,
wherein the topmost layer of the second region of the one of the plurality of electrode layers is the reflective layer having a different material from the bonding layer,
wherein the plurality of electrode layers further includes a seed layer disposed between the insulating layer and the thermal diffusion layer,
wherein the seed layer physically contacts the insulating layer and the thermal diffusion layer,
wherein the thermal diffusion layer has the thickness thicker than a thickness of the seed layer,
wherein a plurality of protrusions are protruded from a top surface of the plurality of electrode layers in the cavity and are contacted with the molding member,
wherein the reflective layer includes a top surface and a bottom surface opposite the top surface of the reflective layer disposed on a bottom surface of the cavity,
wherein the plurality of protrusions are protruded from the top surface of the reflective layer and are located at a position lower than a top surface of the light emitting diode, and
wherein the bottom surface of the reflective layer corresponding to the plurality of protrusions is a flat surface.

10. The light emitting device package of claim 9, wherein the first and second regions of the one of the plurality of electrode layers include:
a barrier layer between the thermal diffusion layer and the bonding layer, and
the second region of the one of the plurality of electrode layers includes:
an adhesive layer contacted between the reflective layer and the bonding layer,
wherein the bonding layer, the barrier layer and the thermal diffusion layer include different materials from each other, and
wherein the thermal diffusion layer has the thickness thicker than a combined thickness of the barrier layer and the seed layer.

11. The light emitting device package of claim 10, wherein the thickness of the thermal diffusion layer is in a range of 30-50 µm and the thermal diffusion layer is formed in only one Cu layer.

12. The light emitting device package of claim 9, wherein the body includes a silicon-based conductive material, and
wherein the plurality of electrode layers extend to a top surface, a lateral side and a lower surface of the body.

13. The light emitting device package of claim 9, wherein the thermal diffusion layer includes at least one of Cu, Al, Au and Ag, and
wherein the reflective layer includes at least one selected from the group consisting of Al, an Al alloy, Ag, and an Ag alloy.

14. The light emitting device package of claim 9, wherein the bonding layer has a surface roughness of about 30 nm or less and includes an Au material, and
wherein the surface roughness of the bonding layer is directly contacted with the bonding member.

15. A light emitting device package comprising:
a body;
an insulating layer contacted with a surface of the body;
a first electrode layer on the insulating layer;
a second electrode layer disposed on the insulating layer and spaced apart from the first electrode layer;
a light emitting diode on the first electrode layer; and
a bonding member between the light emitting diode and the first electrode layer and directly connected to the light emitting diode, wherein the bonding member has a width wider than a width of an entire bottom surface of the light emitting diode,
wherein the first and the second electrode layers include a thermal diffusion layer and a reflective layer on the thermal diffusion layer, and the thermal diffusion layer has a thickness thicker than a thickness of the reflective layer by at least twenty times,
wherein the first electrode layer includes a first region corresponding to the entire bottom surface of the light emitting diode and a second region at an outer portion of the first region,
wherein the first and second regions of the first electrode layer each include a bonding layer,
wherein the topmost layer of the first region of the first electrode layer is the bonding layer contacted with the bonding member,
wherein the topmost layer of the second region of the first electrode layer is the reflective layer having a different material from the bonding layer,
wherein the first and electrode layers each further include a seed layer disposed between the insulating layer and the thermal diffusion layer,
wherein the seed layer physically contacts the insulating layer and the thermal diffusion layer,
wherein the thermal diffusion layer has the thickness thicker than a thickness of the seed layer and is formed in only one layer,
wherein the insulating layer is contacted between the seed layer and the body,
wherein the thickness of the thermal diffusion layer is at least 85% of a thickness of the first electrode layer,
wherein the bonding layer, the seed layer and the thermal diffusion layer include different materials from each other,
wherein the thickness of the first electrode layer is thicker than a thickness of the insulating layer by at least twenty times, wherein the thermal diffusion layer is formed of a layer of only copper (Cu) having a thickness in a range of 30 µm±2 µm, wherein the first region of the first electrode layer includes at least four metal layers, wherein the second region of the first electrode includes at least six metal layers, and wherein the second electrode layer includes at least six metal layers.

16. The light emitting device package of claim 15, wherein the first and second electrode layers include:

an adhesive layer between the bonding layer and the reflective layer; and a barrier layer between the thermal diffusion layer and the bonding layer, wherein the bonding layer, the adhesive layer and the barrier layer include different materials from each other, and wherein the thermal diffusion layer has the thickness thicker than a thickness of each of the bonding layer, the adhesive layer and the barrier layer.

17. The light emitting device package of claim 15, wherein the bonding layer has a surface roughness of about 30 nm or less and includes an Au material, and wherein the surface roughness of the bonding layer is directly contacted with the bonding member.

18. The light emitting device package of claim 15, wherein the reflective layer includes at least one material selected from the group consisting of Al, an Al alloy, an Ag and an Ag alloy.

19. The light emitting device package of claim 15, further comprising a molding member disposed on the first and second electrode layers, wherein the body has a cavity with an open top surface, and wherein the molding member and the light emitting diode are disposed in the cavity.

* * * * *